United States Patent

Monroe et al.

[15] 3,683,367

[45] Aug. 8, 1972

[54] DIGITAL AUTOMATIC GAIN CONTROL

[72] Inventors: Kenneth E. Monroe; Samuel T. Harmon, Jr., both of Ann Arbor, Mich.

[73] Assignee: Datamax Corporation, Ann Arbor, Mich.

[22] Filed: Feb. 12, 1970

[21] Appl. No.: 10,771

[52] U.S. Cl. .................340/347 AD, 330/29, 330/85

[51] Int. Cl. ..........................H03k 13/02, H03g 3/20

[58] Field of Search.......340/347 AD, 146.3; 330/29, 330/85, 144, 145, 85

[56] References Cited

UNITED STATES PATENTS

| | | | |
|---|---|---|---|
| 3,573,794 | 4/1971 | Widenor | 340/347 AD |
| 3,471,832 | 10/1969 | Pawletko | 340/146.3 |
| 3,148,366 | 9/1964 | Schulz | 340/347 |
| 3,533,098 | 10/1970 | Munoz | 340/347 |
| 3,475,748 | 10/1969 | Price et al | 340/347 |

OTHER PUBLICATIONS

McKeon; IBM Technical Disclosure Bulletin, " Amplifier Gain Selection With Noise Tolerance," Vol. 10, No. 5, October 1967, p. 563

*Primary Examiner*—Maynard R. Wilbur
*Assistant Examiner*—Leo H. Boudreau
*Attorney*—Barnard, McGlynn and Reising

[57] ABSTRACT

An analog to digital signal converting amplifier with automatic gain control. Input analog signal levels are converted to digital form after passing through a variable gain amplifier device. The digital signals are reconverted to analog form and compared to the input analog levels to produce an error signal which is averaged and used to control the gain of the amplifier device. The analog to digital converted produces a maximum output data indication even through the input level may be excessive. A non-zero difference signal is generated even if the digital output is zero.

1 Claim, 1 Drawing Figure

United States Patent
Monroe et al.
[15] 3,683,367
[45] Aug. 8, 1972
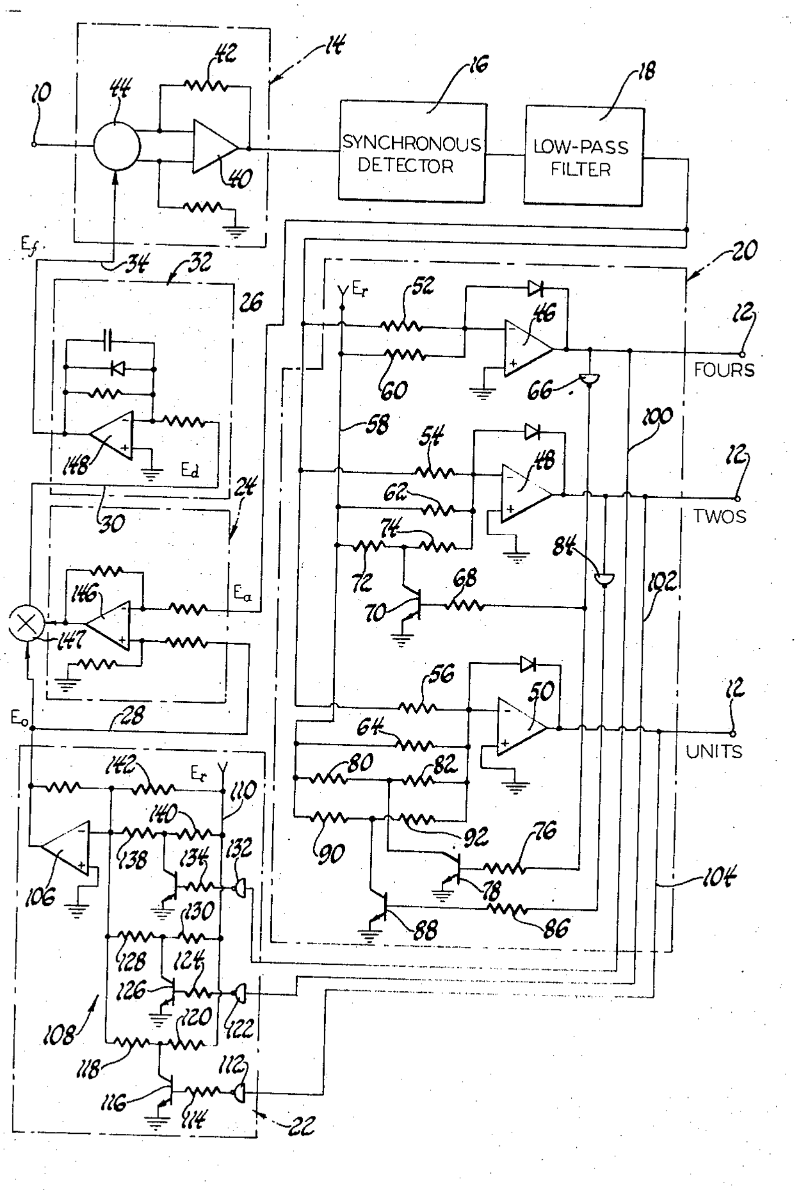

PATENTED AUG 8 1972
3,683,367
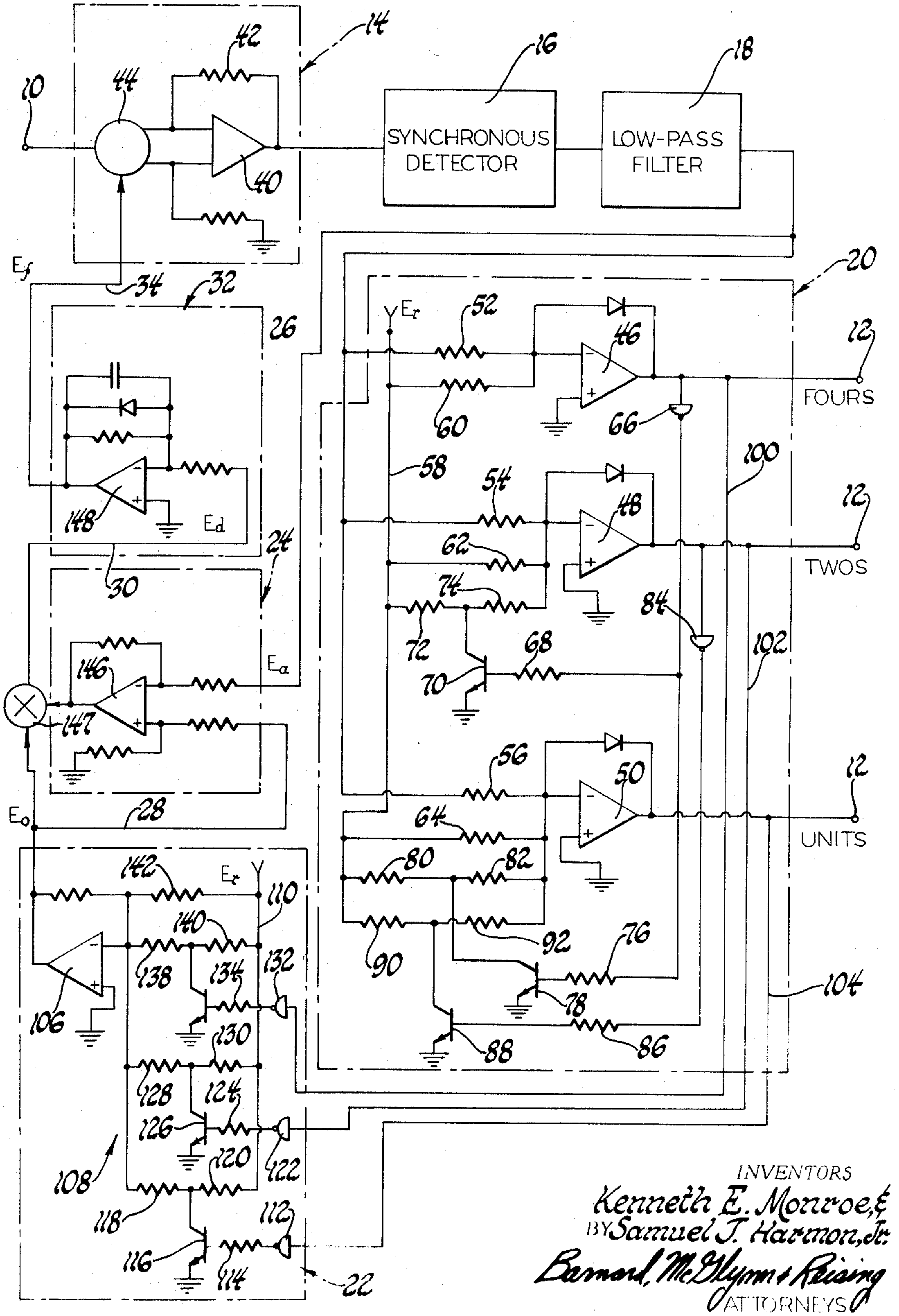
INVENTORS
Kenneth E. Monroe, &
BY Samuel J. Harmon, Jr.
Barnard, McGlynn & Reising
ATTORNEYS

DIGITAL AUTOMATIC GAIN CONTROL

INTRODUCTION

This invention relates to signal responsive amplifier circuits and more particularly to a data detecting amplifier circuit having an automatic gain control feature.

One commonly used type of automatic gain control (AGC) for signal responsive amplifiers senses the average signal level received and adjusts gain until this average is standardized. Such an AGC performs well if the received signal levels continue to vary randomly between minimum and maximum levels but fails to operate properly if the input signal remains at either a maximum or minimum level for an extended period approximating or exceeding the time over which the AGC normally averages. Such an AGC would erroneously reduce the gain setting if maximum or near maximum signals were received for an extended period, for example, such that upon the sudden receipt of minimum or near minimum level input signals the gain setting may be inadequate to make up transmission losses and accordingly the low level signals may be lost. Where the input signal levels represent data which must be preserved in order to maintain the accuracy and integrity of the data stream, such an AGC circuit is inadequate.

Another commonly used type of AGC senses the peak energy received and standardizes gains after only a few received signal levels. Such AGC circuits are usually of the "fast attack, slow release" type so that the acquired setting is maintained until a new signal peak is received. The retention interval of such an AGC must usually be quite long and again where data is represented by the signal levels, low level signals may be lost following a high level signal transmission period or following a noise burst.

The present invention provides an AGC for a signal responsive amplifier which overcomes the disadvantages of the prior art AGC systems, which minimizes the time integral of the signal error magnitude and which is thereby particularly adapted for use in systems where the received signal levels represent data and wherein the received signal levels may dwell on either a maximum or minimum level for a significant period.

In accordance with the invention a signal responsive circuit includes an AGC loop which attains a proper gain setting after a few received signal levels and properly retains such setting even though a maximum or minimum data signal level may be received for an interval of appreciable length. In general, the present invention involves a signal channel including input means in the form of a variable gain device adapted to receive a variable level input signal and an output means such as a signal converter having a fixed maximum output data level which is less than the maximum output level of the input means at a high gain setting. The invention further comprises feedback means for producing a feedback signal related to the difference between the output levels of the input and output means, this signal being operatively connected to control the gain of the input means so as to reduce the feedback signal toward zero and to maintain the feedback signal at zero as long as input levels within the data range of the output means are being detected and received regardless of the average value of those signals.

According to a further feature of the invention, the feedback means may include means for producing a non-zero feedback signal even though the input signal may remain at a zero level for an extended period. Thus, on initial set up, the feedback signal sets the input means in a high gain condition which may be reset after higher data level input signals are received. Moreover, once the proper gain setting is achieved, it is maintained even though low data level signals are received since the output levels of the input and output means are equal, thus producing a zero-level feedback signal.

In the specific form, the invention is applied to a data responsive analog-to-digital converter circuit wherein the output means performs the analog to digital conversion. The converter stage, in accordance with the invention, has a fixed maximum output level representing the maximum data level even though the input analog level may exceed the maximum data level. The feedback means comprises a digital-to-analog converter so that the feedback signal is derived from a comparison of analog signals. This converter stage has a non-zero output level even under zero input conditions and is connected to an integrating type averaging circuit such that upon set up of the signal receiver circuit the integral of the feedback signal grows to a maximum level to produce a maximum gain setting. However, the digital-to-analog converter is otherwise proportional to the signal from the analog-to-digital converter such that after gain has been properly set either a continuous period of high or low level input signals produces no change in gain setting.

The invention may be best understood and appreciated by reading the following specification which describes an illustrative embodiment of the invention and is to be taken with the accompanying drawings of which the single figure is a combined block and schematic diagram of an analog-to-digital converter circuit employing the invention.

Referring now to the drawing, the analog-to-digital converter circuit embodying the subject invention comprises an input terminal 10 to which is applied an amplitude modulated carrier signal wherein the various amplitude levels represent data, and a set of output terminals 12 upon which appear digital signals representing the input amplitude levels in binary form. The main signal channel between the input terminal 10 and the output terminal 12 includes a variable gain input amplifier 14 connected to receive the amplitude modulated input signal and apply an amplified form thereof to a detector 16. The detector 16 is a dc amplifier which reproduces the various amplitude levels in the input signal. Detector 16 is connected to a low pass filter 18 which removes the carrier signal and applies the analog input signal Ea to an analog-to-digital converter 20 which converts the various input signal levels to digital form in which the signal is expressed mathematically using a plurality of separate and distinct digits. In the illustrated embodiment, a binary output code is chosen but the invention is not limited to binary codes. The binary signal output from the converter 20 has a fixed maximum numerical value which cannot be exceeded even though the input analog signal level Ea exceeds the maximum data signal sensitivity of the converter 20.

The circuit of FIG. 1 further includes feedback means connected between the output of the analog-to-digital converter 20 and the control input of the variable gain input amplifier 14 to vary the amplifier gain in such a fashion as to standardize the gain at a level which produces the proper data interpretation. The feedback means includes a digital-to-analog converter 22 having inputs connected to the output lines of the analog-to-digital converter 20 to reconvert the output digital signal back to analog form. Converter 22 thus produces an analog output Eo which represents the digital output appearing on terminals 12.

The analog output of converter 22 is generally directly proportional to the digital input from converter 20. However, converter 22 produces a small but finite output signal level under zero input level conditions. The analog output signal Eo of converter 22 is applied along with the input analog signal level $E_a$ to a comparator 24, the input analog levels $E_a$ appearing on line 26 and the output analog equivalent $E_o$ appearing on line 28. Comparator 24 produces an output signal $E_d$ on line 30 which represents the difference between the signals $E_a$ and $E_o$. The difference signal $E_d$ is applied to an integrator 32 which operates as an averaging filter to produce an output signal $E_f$ equal to the time integral of the input signals applied thereto. The signal $E_f$ is applied over a line 34 to the gain control input of the input amplifier 14 to control the gain in such a direction as to reduce the difference signal $E_d$ toward zero.

Describing the operation of the circuit of FIG. 1 briefly, when the input signal level applied to terminal 10 is zero the output of the low-pass filter 18 is also zero. Accordingly, the signal $E_a$ applied to the analog to digital converter 20 and to the comparator 24 is zero and the output appearing on terminals 12 is zero. However, the output from digital analog converter 22 is a non-zero signal which results in the production of a small negative difference signal $E_d$ from the comparator 24. This difference signal is integrated by integrator 32 such that over a period of time a maximized signal $E_f$ is applied to the gain control input of input means 14 to increase the gain to a maximum level. As soon as a few maximum level input signals are received on terminal 10, the gain of input means 14 is quickly reduced. This is accomplished due to the fact that at the previous high gain setting, the signal $E_a$ will exceed the data level recognition sensitivity of the analog-to-digital converter 20. However, the converter 20 nevertheless produces the maximum data signal output on terminals 12 and digital-to-analog converter 22 produces an output signal $E_o$ on line 28 representing this value. At the comparator 24 the large signal $E_a$ will exceed the value of the output signal representation $E_o$ on line 28 and a positive difference signal $E_d$ will appear on line 30. This signal immediately begins reducing the output of the integrator 32 $E_f$ since $E_a$ now exceeds $E_o$. Once the proper gain setting has been attained, it is essentially unchanged as long as the input signal level remains within the range of data level sensitivity of the analog to digital converter 20. This follows from the fact that as long as the input signal level $E_a$ results in the production of a corresponding digital output level, the signal $E_o$ from the digital-to-analog converter 22 will equal $E_a$ and the difference signal $E_d$ will be zero. Accordingly, no significant gain change will be accomplished as long as the signals remain within the proper range.

Describing the circuit in greater detail, the variable gain input amplifier 14 is shown to comprise an operational amplifier 40 having a feedback circuit 42 which permits the amplifier to produce an output signal representing the product of the two input signals applied thereto. The two input signals are the amplitude modulated carrier applied to terminal 10 and the slowly varying gain control signal $E_f$ appearing on line 34. A mixer 44 is employed to combine the signal $E_f$ with the carrier frequency for application to the operational amplifier 40.

Synchronous detector 16 detects the amplitude modulations at the modulated rate and applies the signals representing the various amplitude levels to the low-pass filter 18 which simply removes the carrier frequency from the total signal. The variable amplitude levels which emerge from the low-pass filter 18 thus constitute the analog input signals $E_a$ which in actual form is a negative voltage of varying amplitude.

The analog-to-digital converter 20 is shown to include operational amplifiers 46, 48 and 50, the outputs of which are connected to terminals 12 to represent the respective bits in the binary expression corresponding to the amplitude level of the input signal $E_a$. Amplifiers 46, 48 and 50 are connected to receive the input signal $E_a$ through single unit resistors 52, 54, 56, respectively. In addition each of the amplifiers is connected to receive a certain portion of a positive reference potential $E_r$ which is set by a positive DC voltage source connected to reference line 58. Line 58 is connected to the negative input of amplifier 46 across a two-unit resistor 60. Reference line 58 is connected to the negative input of amplifier 48 through a four-unit resistor 62 and to the negative input of amplifier 50 through an eight unit resistor 64. Accordingly, the amplifiers 46, 48 and 50 each have a different signal amplitude threshold to which they respond to produce an output. In general, amplifier 50 responds to the lowest value signal quantity to produce an output while amplifier 46 responds to the highest signal value to produce an output. Accordingly, the output of amplifier 50 represents the least significant digit in the binary output expression readable on terminals 12 and the output of amplifier 46 represents the most significant digit in the expression. It is, of course, to be understood that the three bit expression is chosen for illustration only and that any desired number of bits may be represented in the binary expression by suitable extension of the circuit shown for the converter 20 in FIG. 1. The specific transfer characteristic of converter 20 is as shown in the following table.

TABLE I

| Analog Input Voltage $E_a$ | Output Binary Indication | Decimal Equivalent |
|---|---|---|
| $0 \leq E_a \leq E_r 18$ | 000 | 0 |
| $E_r/8 \leq E_a \leq E_r/4$ | 001 | 1 |
| $E_r/4 \leq E_a \leq 3E_r/8$ | 010 | 2 |
| $3E_r/8 \leq E_a \leq E_r/2$ | 011 | 3 |
| $E_r/2 \leq E_a \leq 5E_r/8$ | 100 | 4 |
| $5E_r/8 \leq E_a \leq 3E_r/4$ | 101 | 5 |
| $3E_r/4 \leq E_a \leq 7E_r/8$ | 110 | 6 |
| $7E_r/8 \leq E_a \leq E_r$ | 111 | 7 |
| $E_a > E_r$ | 111 | 7 |

It is apparent from the Output Binary Indication expressions of Table I above that a high threshold amplifier must partially override and reverse bias a lower threshold amplifier in order to generate the proper expression. Amplifier 46 must, for example, reverse bias amplifier 48 while the input $E_a$ is between one half and three quarters of the reference voltage value $E_r$ to ensure that the second digit in the expression is a ZERO. To accomplish this, the output of amplifier 46 is connected through an inverter 66 and a resistor 68 to the base electrode of an NPN transistor 70 which is connected to ground the junction between a pair of bias resistors 72 and 74 when conductive. The resistor 72 is connected to the reference potential line 58 and the resistor 74 is connected to the negative input amplifier 48. Similarly, the output of amplifier 46 is connected through the inverter 66 and a resistor 76 to the base electrode of an NPN transistor 78 which is connected to ground the junction between two single unit resistors 80 and 82 when conductive. Again, the other side of resistor 80 is connected to the reference potential line 58, and the other side of resistor 82 is connected to the negative input of amplifier 50. Similarly, the output of amplifier 48 is connected through an inverter 84 and a resistor 86 to the base electrode of an NPN transistor 88 which operates to ground the junction between two unit resistors 90 and 92 when conductive. The other side of resistor 90 is connected to the reference potential line 58 and the other side of resistor 92 is connected to the negative input of amplifier 50.

Accordingly, when a low-level input signal $E_a$ is produced only amplifier 50 responds to produce an output signal. When the next higher increment input signal is produced, both amplifiers 48 and 50 respond but the output of amplifier 48 operates to render transistor 88 conductive thereby grounding the junction between the two-unit resistors 90 and 92. This produces a reverse bias on amplifier 50 which tends to turn amplifier 50 off leaving only amplifier 48 on. The next higher increment of input tends to override the bias exerted by amplifier on amplifier 50 and turn amplifier 50 back on. The next higher increment of input signal overcomes the threshold of amplifier 46 turning that amplifier on. The reverse bias feedback through inverter 66 to the transistors 70 and 78 reverse biases amplifiers 48 and 50 turning them off. The next higher increment input overcomes the reverse bias on amplifier 50 and turns it back on. The next highest signal increment overcomes the reverse bias on amplifier 48 and turns it on; however, it now applied an additional reverse bias to amplifier 50 which turns it off. The next and highest signal increment turns all three amplifiers on. As shown in Table I any input signal $E_a$ which is greater than the reference potential applied to line 58 turns all three amplifiers 46, 48 and 50 on to produce the highest output binary indication or 111.

Continuing with the detailed description of the circuit, the outputs of the analog-to-digital converter amplifiers 46, 48 and 50 are connected by way of feedback lines 100, 102, and 104 to the digital-to-analog converter 22. As previously stated, the function of the converter 22 is to reconvert the binary output of converter 20 to analog form. To accomplish this, converter 22 includes an operational amplifier 106 having a grounded positive input and a negative input connected to a current summer 108 having a positive supply and reference potential connected to line 110, as shown.

The lowest increment of input current is generated by the signal on line 104 which is applied through an inverter 112 and a resistor 114 to the base of the transistor 116 which grounds the junction between two two-unit resistors 118 and 120 when conductive. The other side of resistor 118 is connected to the negative input of amplifier 106. The other side of resistor 120 is connected to the reference potential line 110. The next increment of input current is controlled by input line 102 which is connected through an inverter 122 and a resistor 124 to the base electrode of a transistor 126 which grounds the junction between two single unit resistors 128 and 130 when conductive. The other side of resistor 128 is connected to the negative input of amplifier 106 and the other side of resistor 130 is connected to the positive reference potential line 110. The next highest increment of input current is controlled by the feedback line 100 which is connected through an inverter 132 and a resistor 134 to the base electrode of a transistor 136 which is connected to ground the junction between two half-unit resistors 138 and 140. The other side of resistor 138 is connected to the negative input of amplifier 106 and the other side of resistor 140 is connected to the positive reference potential line 110.

The transfer characteristic of the digital-to-analog converter 22 is substantially the inverse of the transfer characteristic of converter 20; that is, the converter produces an analog signal for a digital input which digital input is received from converter 20. More specifically, the transfer characteristic of the converter 22 is represented by the following table.

TABLE II

| $E_o$ | Fours | Twos | Units |
|---|---|---|---|
| $E_r/16$ | 0 | 0 | 0 |
| $3E_r/16$ | 0 | 0 | 1 |
| $5E_r/16$ | 0 | 1 | 0 |
| $7E_r/16$ | 0 | 1 | 1 |
| $9E_r/16$ | 1 | 0 | 0 |
| $11E_r/16$ | 1 | 0 | 1 |
| $13E_r/16$ | 1 | 1 | 0 |
| $15E_r/16$ | 1 | 1 | 1 |

As previously described, the converter 22 produces a finite output $E_o$ on line 28 even when the signals on the input lines 100, 102, and 104 are all ZEROS and the transistors 116, 126, and 136 are all non-conductive. This is accomplished by means of the eight-unit resistor 142 which is connected between the positive reference potential line 110 and the negative input of amplifier 106. This current path produces a small increment of input current under otherwise zero input conditions to produce a small output increment $E_o$.

The comparator 24 is connected to receive the amplified analog signal $E_a$ and the analog output $E_o$ representing the digital quantity produced on the output terminals 12 and to determine the potential difference between these quantities. In the illustrated circuit, both $E_a$ and $E_o$ are negative potentials. To accomplish this the comparator 24 comprises a difference amplifier in the form of an operational amplifier 146 having a resistive feedback connection and having the negative input connected to receive the analog value $E_a$ and the positive input connected to receive the data analog signal $E_o$. The difference signal $E_d$, which appears on line 30, is zero if $E_a$ equals $E_o$; is positive if $E_a$ is greater than $E_o$; and is negative if $E_a$ is less than $E_o$. The difference signal $E_d$ is applied to the integrator 32 operating as an averaging filter. The integrator 32 includes a standard integrating amplifier 148 having an RC feedback network. The output of the integrator unit 32 is the signal $E_f$ representing the time integrated average of the signal $E_d$ appearing on line 30.

If necessary, the difference signal $E_d$ may be linearized across the input signal level range by means of a linear multiplier 147 connected to the output of amplifier 146. Multiplier 147 is also connected to receive the $E_o$ signal and to multiply $E_d$ by $E_o$. This results in a difference signal which is approximately linearized or equalized for both maximum and minimum input signals. Means other than the multiplier may be employed; for example, a logic matrix may be employed.

Describing the operation of the circuit in somewhat greater detail, assume that when the circuit of the drawing is first turned on, the receiver is not yet receiving a data signal and the input amplifier 14 is set at minimum gain. Input device 14 is rapidly set to the high gain condition since the digital-to-analog converter 22 produces a finite or non-zero output $E_o$ on line 28. During the production of this output the signal $E_a$ on line 26 is zero and, accordingly, the comparator 24 produces a negative output $E_d$ corresponding to the magnitude of the signal $E_o$ on line 28. The integrator 32 receives this signal and generates an output $E_f$ corresponding to the time integral of it. Accordingly, a positive going ramp function is generated which rises to a positive peak and maintains that peak until an input signal is received. The peak signal on line 34 biases the input amplifier 14 to the maximum gain condition.

If the circuit now receives an input signal on terminal 10 representing the maximum signal quantity 111, the feedback control AGC will operate to reset the gain of the input amplifier 14. Because of the initial high setting, the input signal will produce an analog voltage $E_a$ which is greater than $E_r$ and, thus, higher than the sensitivity range of the converter 20. Nevertheless, converter 20 will decode the signal as the maximum data value or 111 and produce outputs from amplifiers 46, 48, and 50. This binary signal appears on output terminals 12. In addition, these three signals operate digital-to-analog converter 22 to produce an output $E_o$ on line 28 representing in analog form the digital quantity 111. Reference to Table II indicates the value of this quantity relative to the reference voltage $E_r$ on line 110. However, the signal $E_o$ is yet considerably less than the signal $E_a$ and, accordingly, the comparator 24 produces a difference signal $E_d$ which is positive. Accordingly, when averaged in the integrator 32, $E_d$ immediately reduces the output signal $E_f$ on line 34. This decreasing output signal reduces the gain of input means 14 so as to reduce $E_a$ until it is equal to $E_o$. At this point the difference signal $E_d$ goes to zero and the feedback circuit no longer attempts to vary the gain of the input amplifier 14.

The proper gain setting is most rapidly reached if the input stream contains several closely spaced maximum data value signals. However, a random stream of data signals, some of which represent the maximum signal level, or 111, will also result in proper AGC action.

If the initial setting of variable gain input means 14 is too low, the arrival of minimum signal levels, or 000, will most rapidly reset the device to the proper gain setting. It can be seen that under the zero input signal level conditions the finite, or non-zero output of converter 22, rapidly causes the integrator 32 to attain a positive value which rapidly increases the gain setting of the input amplifier 14. Again, a data stream containing a random stream of data, some of which are 000, will result in proper AGC action. However, the most rapid resetting is attained by a steady stream of 000 signals.

It is to be understood that the circuit design, the various resistor designations given above, as well as the fractional current designations shown in the Tables, are for illustrative purposes and are not to be construed as limiting the invention of the application of the invention to the specific values given.

The embodiments of the invention in which an exclusive property or privilege is claimed are defined as follows:

1. An automatic gain control circuit for a data responsive amplifier comprising: variable gain input amplifier means responsive to an analog data signal of variable amplitude to produce a variable amplitude analog output signal the amplitude of which varies between substantially zero and A where A is a finite maximum output level; analog-to-digital output converter means having an input connected to receive the analog output of the variable gain amplifier and a plurality of output terminals, the analog-to-digital converter being operative to produce on said output terminals the digital equivalent of the amplitude of the signal applied to said input terminal up to a finite maximum output signal level B where B is less than A; feedback means connected between the variable gain input amplifier and said output terminals and being operative to vary the gain of said input amplifier and including a digital-to-analog converter having a plurality of input terminals connected to the output terminals of the analog-to-digital converter and further having an output terminal on which an analog signal is produced which is the mathematical equivalent of the signal on said input terminals; a differential amplifier having two input terminals connected to receive the analog output of the input amplifier on one terminal and the analog output of the digital-to-analog converter on another terminal and to compare the signals on said terminals and to produce an error signal related to the difference therebetween; multiplier means connected to receive the output of the digital-to-analog converter as well as the error signal output of the differential amplifier means and being operative to produce a second error signal which varies in amplitude between C and B where C is a finite minimum amplitude signal greater than zero but less than A; integrator means connected to receive the second error signal and to integrate the signal with time to produce a slowly-increasing error signal component, said error signal component being connected to the input amplifier to vary the gain thereof in such a direction as to reduce the feedback error signal toward zero.

* * * * *